US012782916B2

(12) United States Patent
Pan et al.

(10) Patent No.: US 12,782,916 B2
(45) Date of Patent: Nov. 3, 2026

(54) METHOD OF SIMULATING 3D FEATURE PROFILE BY USING SEM IMAGE

(71) Applicant: UNITED MICROELECTRONICS CORP., Hsin-Chu City (TW)

(72) Inventors: Yen-Ting Pan, New Taipei City (TW); Chung-Yi Chiu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 967 days.

(21) Appl. No.: 17/749,176

(22) Filed: May 20, 2022

(65) Prior Publication Data

US 2023/0350381 A1 Nov. 2, 2023

(30) Foreign Application Priority Data

Apr. 29, 2022 (TW) .................................. 111116327

(51) Int. Cl.
*G05B 19/4099* (2006.01)
*G03F 7/00* (2006.01)
(Continued)

(52) U.S. Cl.
CPC ......... *G05B 19/4099* (2013.01); *G03F 7/705* (2013.01); *G06T 7/13* (2017.01);
(Continued)

(58) Field of Classification Search
CPC ...... G05B 19/4099; G05B 2219/35134; G06T 7/73; G06T 7/13; G06T 2207/10061; G06T 2207/30148; G03F 7/705
See application file for complete search history.

(56) References Cited

U.S. PATENT DOCUMENTS

| | | | |
|---|---|---|---|
| 7,171,047 | B2 | 1/2007 | Grinchuk |
| 8,401,273 | B2 | 3/2013 | Momonoi |

(Continued)

FOREIGN PATENT DOCUMENTS

| | | | | |
|---|---|---|---|---|
| CN | 111929980 A | * 11/2020 | ............... | G03F 1/36 |
| TW | 202026631 A | * 7/2020 | ............... | G06T 5/70 |
| WO | WO-2011158239 A1 | * 12/2011 | ............ | G01B 11/02 |

OTHER PUBLICATIONS

Gao et al.A High Speed Surface Illuminated Si Photodiode using Microstructured Holes for Absorption Enhancements at 900-1000 nm Wavelength, ACS Photonics 2017 (Year: 2017).*

(Continued)

*Primary Examiner* — Ryan F Pitaro
*Assistant Examiner* — Adrian Stoica
(74) *Attorney, Agent, or Firm* — Winston Hsu

(57) ABSTRACT

A method for simulating a three-dimensional (3D) feature profile of a semiconductor device disposed in a substrate is disclosed. The method utilizes a scanning electron microscope (SEM) image of a feature pattern within a material layer. The feature pattern has an inner edge and an outer edge. The positions of these edges are first identified, followed by the definition of a side edge region. A side edge model is then automatically generated to simulate a side edge profile of the feature pattern. Finally, a 3D feature profile is automatically output based on the positions of the edges, the thickness of the material layer, and the side edge profile. This 3D feature profile is then used for a process judgment of the semiconductor device.

8 Claims, 4 Drawing Sheets

(51) Int. Cl.
*G06T 7/13* (2017.01)
*G06T 7/73* (2017.01)

(52) U.S. Cl.
CPC ...... *G06T 7/73* (2017.01); *G05B 2219/35134* (2013.01); *G06T 2207/10061* (2013.01); *G06T 2207/30148* (2013.01)

(56) References Cited

U.S. PATENT DOCUMENTS

| | | | | |
|---|---|---|---|---|
| 2003/0163295 | A1* | 8/2003 | Jakatdar | G06F 30/20 703/14 |
| 2004/0120578 | A1* | 6/2004 | Grinchuk | G06T 7/0006 382/199 |
| 2009/0023293 | A1* | 1/2009 | Chun | H10D 64/01326 702/85 |
| 2016/0292845 | A1 | 10/2016 | Cheng | |
| 2018/0143110 | A1 | 5/2018 | Delpy | |

OTHER PUBLICATIONS

Meng, CN 111929980 A Method for Enhancing Precision of Two-dimensional Graphic OPC Model (Year: 2020).*
Boaz (Year: 2011).*
Gao et al A High Speed Surface Illuminated Si Photodiode using Microstructured Holes for Absorption Enhancements at 900-1000 nm Wavelength, ACS Photonics 2017 (Year: 2017) (Year: 2017).*

* cited by examiner

METHOD OF SIMULATING 3D FEATURE PROFILE BY USING SEM IMAGE

BACKGROUND OF THE INVENTION

1. Field of the Invention

The present invention relates to a method of simulating 3D (three-dimensional) feature profile, and more particularly to a method of simulating 3D feature profiles based on scanning electron microscope (SEM) images.

2. Description of the Prior Art

Scanning electron microscope (SEM) is mainly used to observe the physical structure of the sub-micron scale on the solid surface. The characteristic of SEM is that the pattern on the photoresist, the insulating layer or the metal layer can be observed and measured without pre-processing steps such as slicing or metal coating the wafer. Transmission Electron Microscopy (TEM) can provide the internal structure or crystal atomic structure of materials. Because of its high resolution capability, TEM is much superior to general image observation and analysis tools, and is widely used in material analysis. TEM uses electron beam to hit the sample, and then enlarges the image. Therefore, the thickness of the area to be observed on the sample should be sliced to a level that electron beam can penetrate.

However, using TEM to observe structures of materials costs much in time and charge a lot; therefore there is a need for a less expensive way to observe the inner structures of materials.

SUMMARY OF THE INVENTION

According to a preferred embodiment of the present invention, a method of simulating a 3D feature profile by using a scanning electron microscope (SEM) image includes providing an SEM image. The SEM image includes a feature pattern within a material layer. The feature pattern includes an inner edge and an outer edge. The outer edge surrounds the inner edge. Then, the positions of the inner edge and the outer edge of the feature pattern are identified. Latter, a side edge region is defined based on the positions of the inner edge and the outer edge. Subsequently, a side edge model is generated automatically to simulate a profile of the feature pattern in the side edge region. Finally, a 3D feature profile is automatically output based on the position of the inner edge, the position of the outer edge, the thickness of the material layer and the side edge profile These and other objectives of the present invention will no doubt become obvious to those of ordinary skill in the art after reading the following detailed description of the preferred embodiment that is illustrated in the various figures and drawings.

DETAILED DESCRIPTION

Figure 1:
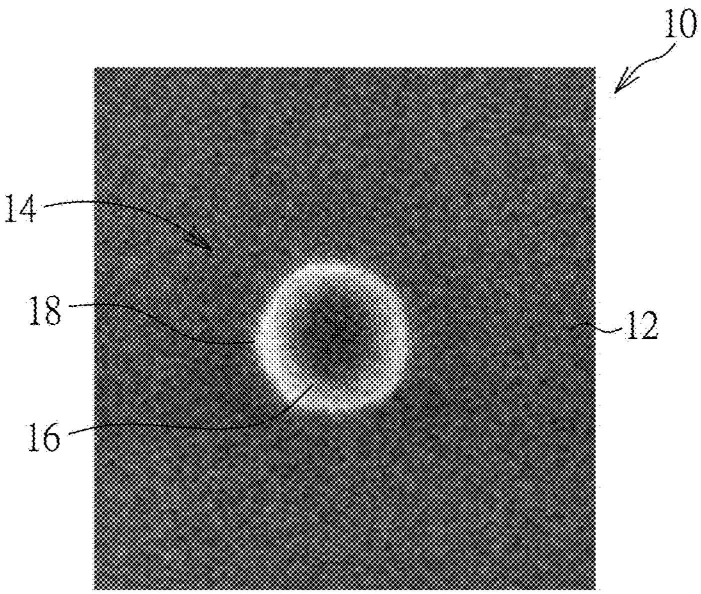
FIG. 1 shows an SEM image.
Figure 6:
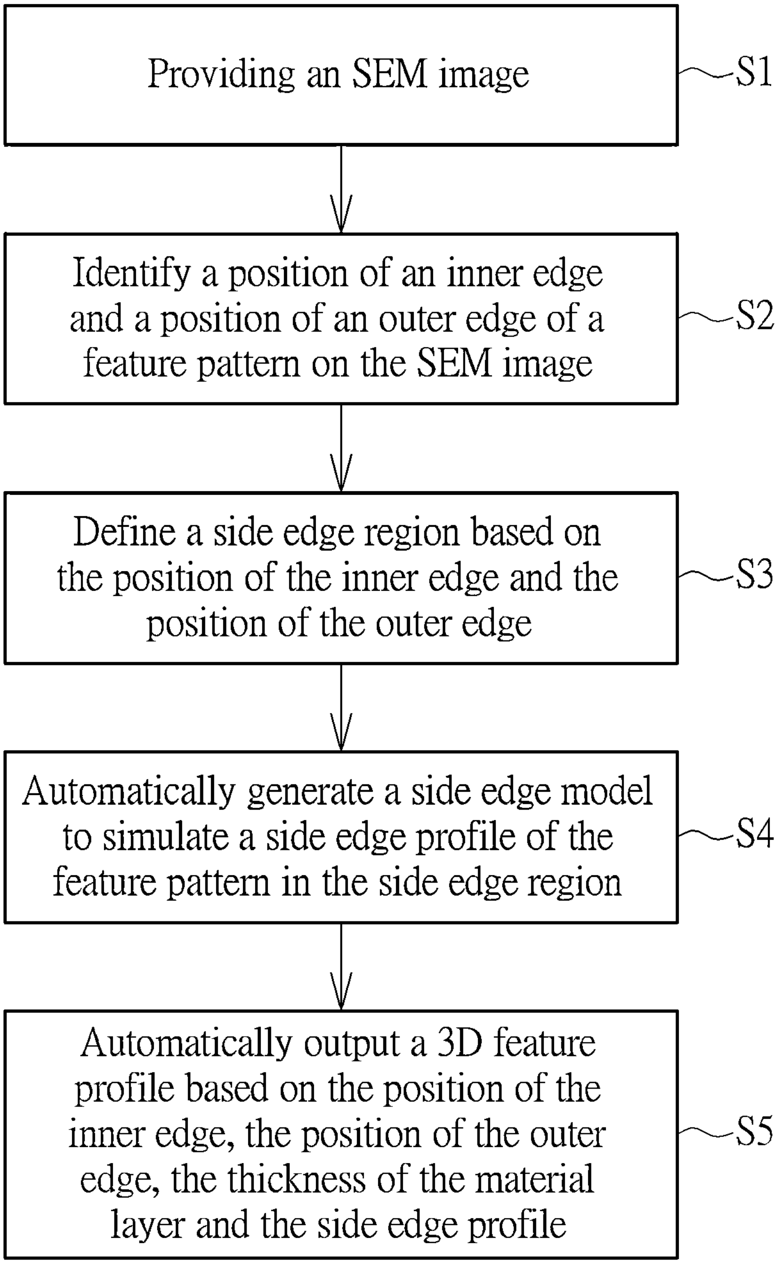
FIG. 6 depicts a flowchart of a method of simulating a 3D feature profile by using an SEM image according to a preferred embodiment of the present invention.

As shown in FIG. 1 and a step S1 in FIG. 6, a scanning electron microscope (SEM) image 10 is provided. The SEM image 10 may be an after develop inspection (ADI) image or an after etching inspection (AEI) image. The SEM image 10 includes a feature pattern 14 on a material layer 12. The feature pattern 14 includes an inner edge 16 and an outer edge 18. The outer edge 18 surrounds the inner edge 16. The SEM image 10 may be a top view of a contact hole, a top view of a rectangular trench, a top view of a source/drain doping region or a top view of any semicoductive device. In this embodiment, the SEM image 10 is shown as top view of a contact hole. The material layer 12 may be a semiconductive substrate or an insulating layer.

Figure 2:
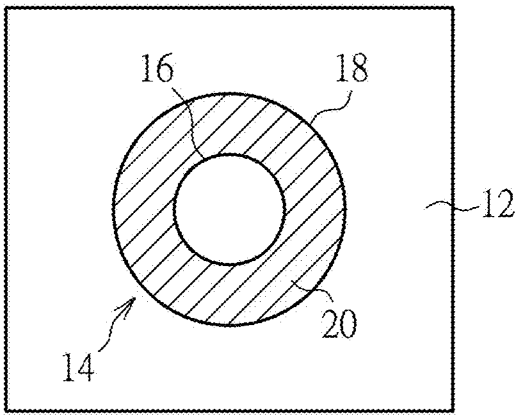
FIG. 2 to FIG. 5 depict a method of simulating a 3D feature profile by using an SEM image according to a preferred embodiment of the present invention.

As shown in FIG. 2 and a step S2 in FIG. 6, a position of the inner edge 16 and a position of the outer edge 18 of the feature pattern 14 on the material layer 12 are identified. The position of the inner edge 16 and the position of the outer edge 18 can be identified by using an edge detecting program or a contrast analysis method. In this way, positions such as coordinates of the inner edge 16 and the outer edge 18 on the material layer 12 can be decided. In details, to identify the position of the inner edge 16 and the position of the outer edge 18 means to locate the inner edge 16 and the outer edge 18 on the surface of the material layer 12.

Figure 3:
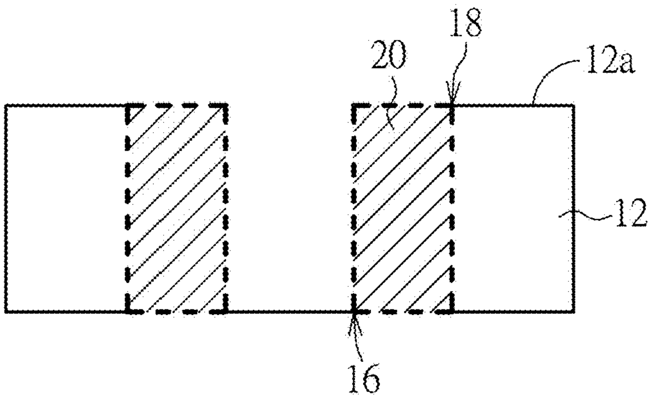

As shown in FIG. 2 and a step S3 in FIG. 6, a side edge region 20 can be defined by the position of the inner edge 16 and the position of the outer edge 18. Next, as shown in FIG. 3, actual positions of the inner edge 16, the outer edge 18 and the side edge region 20 can be decided by using a thickness of the material layer 12. FIG. 3 shows positions of the inner edge 16, the outer edge 18 and the side edge region 20 on the material layer 12 by using a sectional view of the material layer 12. The thickness of the material layer 12 can be obtained by measuring. The sectional view of the material layer 12 is perpendicular to the top view of the material layer 12. Moreover, in this embodiment, the depth of the inner edge 16 and the outer edge 18 on the material layer 12 is exemplified as that the position of the inner edge 16 is located away from the top surface 12*a* of the material layer 12, and the position of the outer edge 18 is located at the top surface 12*a* of the material layer 12. But in the different embodiment, the position of the outer edge 18 is located away from the top surface 12*a* of the material layer 12, and the position of the inner edge 16 is located at the top surface 12*a* of the material layer 12.

Figure 4:
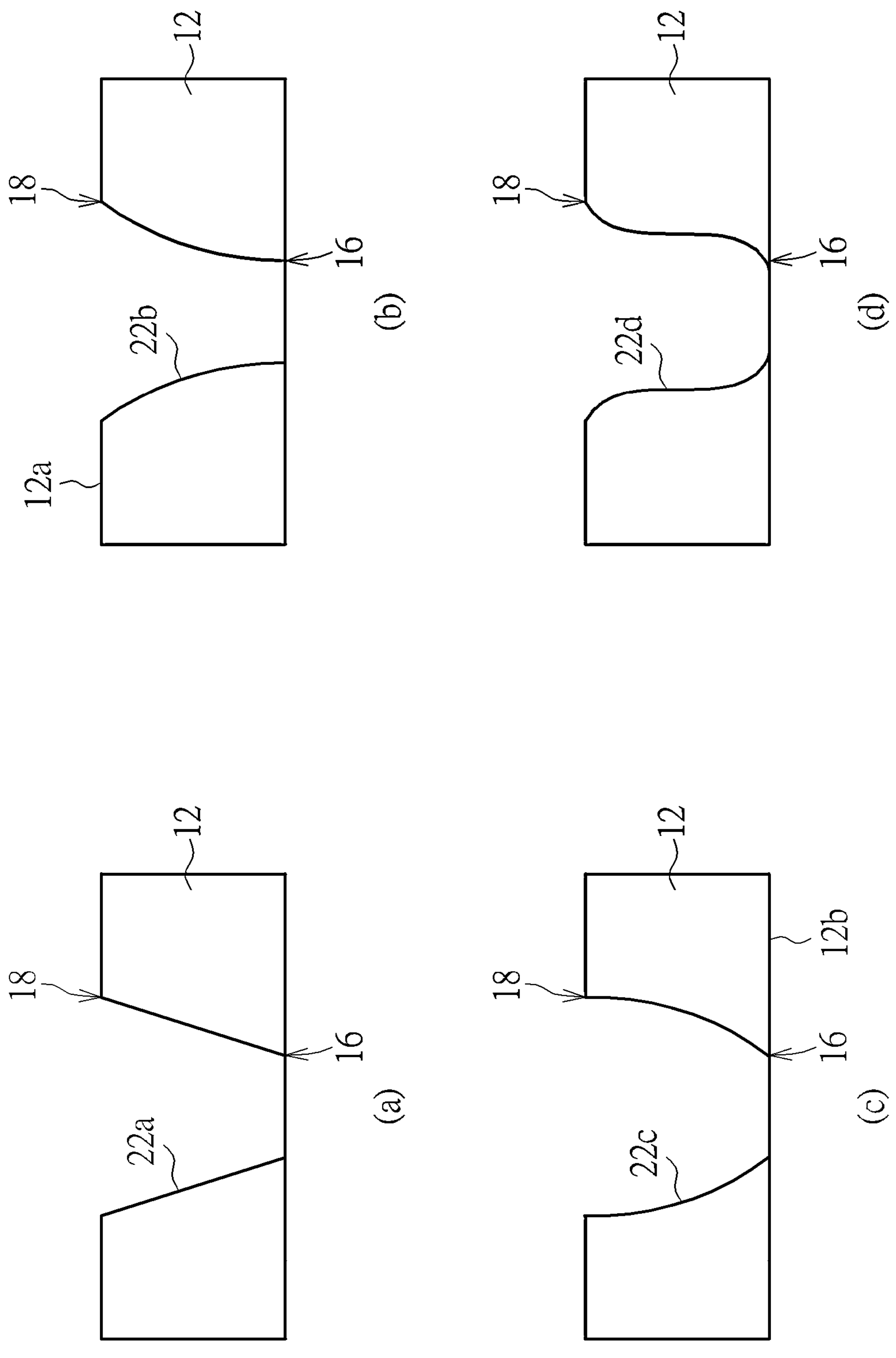

As shown in FIG. 4 and a step S4 in FIG. 6, a side edge model is automatically generated by algorithm to simulate a side edge profile 22*a*/22*b*/22*c*/22*d* of the feature pattern in the side edge region 20. Please refer to FIG. 3 for the position of the side edge region 20. Before simulating a 3D feature profile, numerous SEM images and the transmission electron microscope (TEM) images respectively corresponding to the SEM images are used as sample to build up polynomial data base as side edge models.

Based on different types of the SEM image, different parameters can be used to generate the side edge model. For instance, when forming the side edge model, lithographic parameters can be inputted into the polynomial data base to generate the side edge model. The lithographic parameters include focus offset, exposure energy, photoresist type, development time or baking temperature of photoresist. On the other hand, etching parameters can be inputted into the polynomial data base to generate the side edge model. The etching parameters include etching machine type, a material of the material layer, etchant type, operational power of an etching process, operational pressure of an etching process or temperature of a wafer chuck. However, the parameters are not limited to the above-mentioned parameters. Any parameter that may influence the shape of the side edge profile can be used as parameters.

As shown I FIG. 4, when viewing from the sectional view, the side edge profile 22*a* of the side edge region 20 may be a slope with no curvature. In other way, the side edge profile 22*a* of the side edge region 20 may be a convex line curved toward a top surface 12*a* of the material layer 12. Alternatively, the side edge profile 22*c* of the side edge region 20 may be a convex line curved toward a bottom surface 12*b* of the material layer 12. On the other hand, the side edge profile 22*d* of the side edge region 20 may be a curved line curved toward different directions. But, the side edge profile is not limited to the above-mentioned shaped. The side edge profile within the side edge region 20 can be a profile which formed by slopes, convex lines or curved lines mentioned above.

Figure 5:
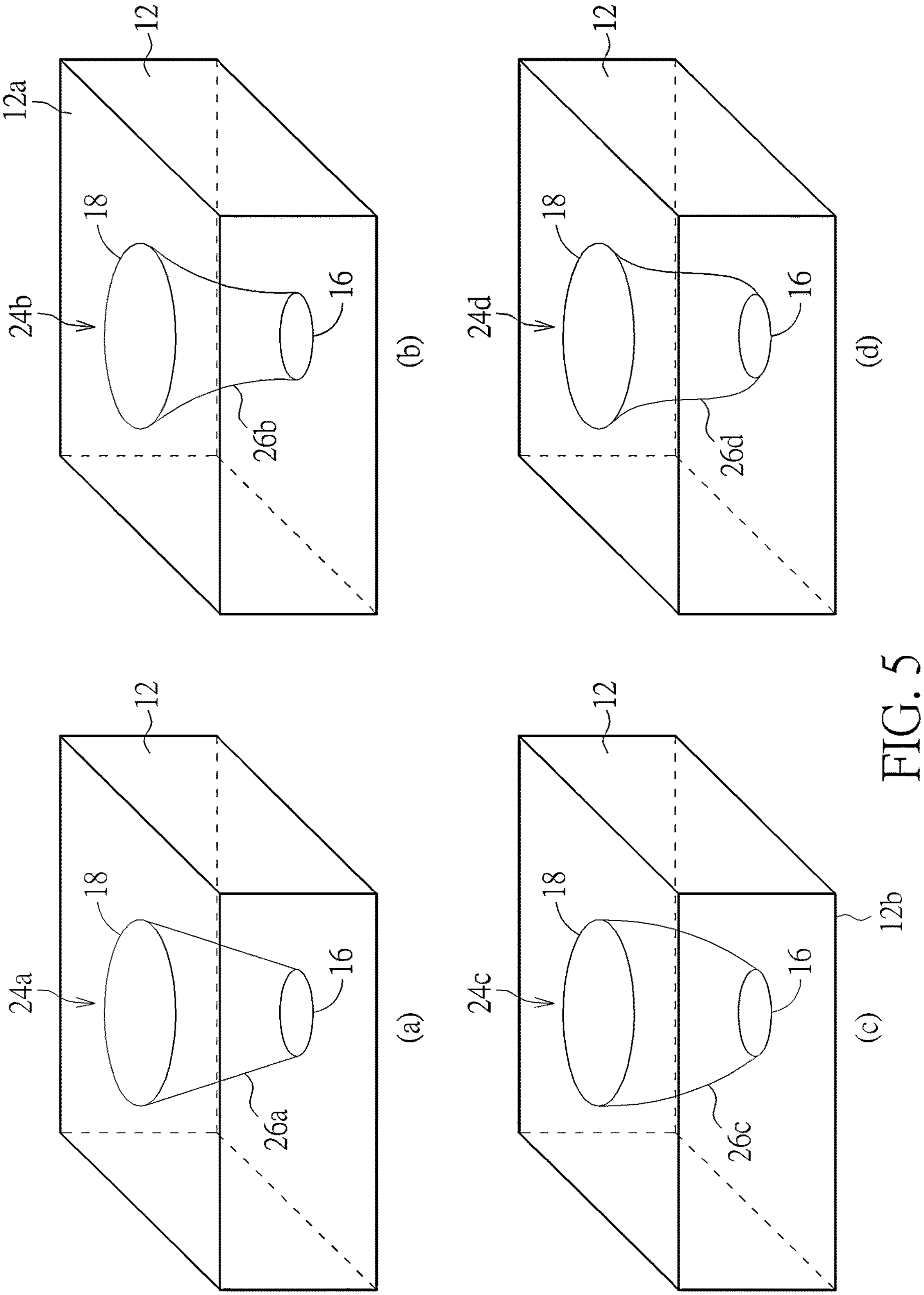

As shown in FIG. 5 and a step S5 in FIG. 6, a 3D feature profile 24*a*/24*b*/24*c*/24*c* is automatically outputted based on the position of the inner edge 16, the position of the outer edge 18, the thickness of the material layer 12 and the side edge profile 22*a*/22*b*/22*c*/22*d*. The 3D feature profile 24*a* in FIG. 5 is outputted based on the position of the inner edge 16, the position of the outer edge 18, the thickness of the material layer 12 and the side edge profile 22*a* in the example (a) of FIG. 4. The 3D feature profile 24*a* is one of possible 3D structures of the feature pattern 14 in FIG. 1, and is formed by simulation. 3D feature profiles 24*b*/24*c*/24*d* in FIG. 5 are other embodiments of 3D structures of the feature pattern 14. In details, 3D feature profiles 24*b*/24*c*/24*d* are generated based on the position of the inner edge 16, the position of the outer edge 18, the thickness of the material layer 12 and the corresponding side edge profiles 22*b*/22*c*/22*d* in the side edge region 20. 3D feature profiles 24*b*/24*c*/24*d* are all embedded within the material layer 12. Each of the 3D feature profiles 24*a*/24*b*/24*c*/24*d* respectively includes a sidewall 26*a*/26*b*/26*c*/26*d*. The sidewalls 26*a*/26*b*/26*c*/26*d* respectively connect the inner edge 16 and the outer edge 18 of the 3D feature profiles 24*a*/24*b*/24*c*/24*d*. Moreover, as shown in the example (a) in FIG. 5, the sidewall 26*a* may be an inclined surface without curvature. As shown in the example (b) in FIG. 5, the sidewall 26*b* can be a convex surface curved toward a top surface of the material layer 12. As shown in the example (c) in FIG. 5, the sidewall 26*c* may be a convex surface curved toward a bottom surface of the material layer 12. As shown in the example (c) in FIG. 5, the sidewall 26*d* may be a curved surface curved toward different directions. However, the sidewall can be other profile which formed by the inclined surface, the convex surface or the curved surface mentioned above. Now, a method of simulating a 3D feature profile by using an SEM image is completed.

Due to the high cost of TEM images, the 3D feature profiles simulated by SEM images of the present invention can be used for preliminary process judgment; therefore, the demand for TEM images is reduced and fabricating cost is decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of simulating a three-dimensional (3D) feature profile of a semiconductor device disposed in a substrate, comprising:

providing a semiconductor device disposed in a substrate;

providing a scanning electron microscope (SEM) image, wherein the SEM image is a feature pattern within a material layer, the feature pattern comprises an inner edge and an outer edge, and the outer edge surrounds the inner edge, and wherein the feature pattern is an SEM image of the semiconductor device and the material layer is an SEM image of the substrate;

identifying a position of the inner edge and a position of the outer edge of the feature pattern;

defining a side edge region based on the position of the inner edge and the position of the outer edge;

automatically generating a side edge model to simulate a side edge profile of the feature pattern in the side edge region by inputting specific manufacturing parameters into a polynomial data base, wherein the polynomial data base is built up by using a plurality of sample SEM images and a plurality of sample transmission electron microscope (TEM) images corresponding to the sample SEM images as side edge models, and wherein the specific manufacturing parameters comprise lithographic parameters or etching parameters; and automatically outputting a 3D feature profile based on the position of the inner edge, the position of the outer edge, a thickness of the material layer and the side edge profile, wherein the thickness of the material layer is obtained by measuring.

2. The method of simulating a 3D feature profile of a semiconductor device disposed in a substrate of claim 1, wherein lithographic parameters are used in generating the side edge model, the lithographic parameters comprise focus offset, exposure energy, photoresist type, development time, or baking temperature of photoresist.

3. The method of simulating a 3D feature profile of a semiconductor device disposed in a substrate of claim 1, wherein etching parameters are used in generating the side edge model, the etching parameters comprise etching machine type, a material of the material layer, etchant type, operational power of an etching process, operational pressure of an etching process or temperature of a wafer chuck.

4. The method of simulating a 3D feature profile of a semiconductor device disposed in a substrate of claim 1, wherein the SEM image comprises an after develop inspection image or an after etching inspection image.

5. The method of simulating a 3D feature profile of a semiconductor device disposed in a substrate of claim 1, wherein in the 3D feature profile, the inner edge is located away from a top surface of the material layer, and the outer edge is located at the top surface of the material layer.

6. The method of simulating a 3D feature profile of a semiconductor device disposed in a substrate of claim 1, wherein the 3D feature profile comprises a sidewall and the sidewall connects the inner edge and the outer edge.

7. The method of simulating a 3D feature profile of a semiconductor device disposed in a substrate of claim 6, wherein the sidewall comprises an inclined surface with no curvature, a convex surface curved toward a top surface of the material layer, or a convex surface curved toward a bottom surface of the material layer.

8. The method of simulating a 3D feature profile of a semiconductor device disposed in a substrate of claim 6, wherein the 3D feature profile is embedded within the material layer.

* * * * *